United States Patent [19]

Okuda et al.

[11] Patent Number: 5,258,074
[45] Date of Patent: Nov. 2, 1993

[54] EVAPORATION APPARATUS COMPRISING FILM SUBSTRATE VOLTAGE APPLYING MEANS AND CURRENT MEASUREMENT MEANS

[75] Inventors: Akira Okuda, Sakai; Yoshikazu Yoshida, Izumi, both of Japan

[73] Assignee: Matsushita Electric Industrial Co., Ltd., Osaka, Japan

[21] Appl. No.: 833,443

[22] Filed: Feb. 7, 1992

[30] Foreign Application Priority Data

Feb. 8, 1991 [JP] Japan ................................ 3-017549

[51] Int. Cl.⁵ ............................................. C23C 14/24
[52] U.S. Cl. .................................... 118/718; 118/715; 118/723 R; 118/724; 204/298.05
[58] Field of Search ............... 118/715, 718, 728, 730, 118/723; 204/298.05

[56] References Cited

U.S. PATENT DOCUMENTS 4,511,594  4/1985  Yanai et al. .................. 118/723 X
4,579,639  4/1986  Enomoto et al. .......... 204/298.05 X
5,180,433  1/1993  Okuda et al. .................... 118/718

OTHER PUBLICATIONS

Schiller et al, "Vacuum Evaporation", Mar. 1978 (translated portions).
Stanley Wolf, Silicon Processing for the VLSI Era, 1986, pp. 377-379.

Primary Examiner—Brian E. Hearn
Assistant Examiner—Jonathan D. Baskin
Attorney, Agent, or Firm—Wenderoth, Lind & Ponack

[57] ABSTRACT

An evaporation apparatus includes a vacuum chamber, a vacuum pump for producing a pressure-reduced atmosphere in the vacuum chamber, at least one vacuum evaporation device for evaporating an evaporation material provided in the vacuum chamber, a drum opposed to the vacuum evaporation device and rotating, for cooling a film substrate on which the evaporation material is to be deposited, a supply roller for supplying the film substrate to the drum, a winding roller for winding the film substrate on which the evaporation material has been deposited, a free roller for assisting the winding and travel of the film substrate, a voltage applying device for applying a DC voltage to the film substrate on which the evaporation material has been deposited; and an electric current measuring device for measuring an intensity of electric current flowing between the film substrate on which the evaporation material has been deposited and the ground.

5 Claims, 3 Drawing Sheets

EVAPORATION APPARATUS COMPRISING FILM SUBSTRATE VOLTAGE APPLYING MEANS AND CURRENT MEASUREMENT MEANS

BACKGROUND OF THE INVENTION

The present invention relates to an evaporation apparatus for forming a metal membrane on a film substrate.

In recent years, an evaporation apparatus has been widely used to evaporate a metal membrane over a magnetic recording tape or a film capacitor or the like.

An example of a conventional evaporation apparatus will be described below with reference to FIG. 3. The apparatus comprises a film substrate 1 to which an evaporated material is attached; an evaporation material 2; a vacuum evaporation means 13, provided on a container 3 for containing the evaporation material 2, consisting of such means as resistance heating, high frequency induction heating, or an electron beam for melting and evaporating the evaporation material 2; a drum 4 rotating in opposition to the vacuum evaporation means and containing cooling liquid circulating so as to cool the surface of the film substrate 1 on which the evaporated material is being deposited; a supply roller 5 for supplying the film substrate 1 to the drum 4; an ungrounded winding roller 6 for winding up the evaporated material-deposited film substrate 1, the surface of which contacts the film substrate 1 and is covered with an insulating tape or an insulating coating material such as polytetrafluoroethylene resin; ungrounded free roller 7a, for assisting the winding or travel of the film substrate 1, the surface of which contacts the film substrate 1 and is covered with an insulating tape or an insulating coating material such as polytetrafluoroethylene resin; an ungrounded free roller 7b for assisting the winding or travel of the film substrate 1 and in conductive contact with the surface of the film substrate 1 on which the evaporated material has been deposited; a vacuum chamber 8; a vacuum pump 9 for evacuating the interior of the vacuum chamber 8; a DC power source for applying, through the free roller 7b, a DC voltage to the evaporated material-deposited film 1.

The operation of the apparatus of the above construction is described below.

The interior of the vacuum chamber 8 is evacuated to a vacuum degree of approximately $5 \times 10^{-5}$ Torr by the vacuum pump 9 such as a rotary pump, oil diffusion pump, or a cryopump. Then, the supply roller 5, the drum 4, and the winding roller 6 are driven. The film substrate 1 travels in order from the supply roller 5, over the free roller 7a, the drum 4, the free roller 7b, and the free roller 7a, and finally is wound around the winding roller 6. The evaporation material 2 is melted and evaporated by the vacuum evaporation means consisting of such means as resistance heating, high frequency induction heating, or electron beam. Evaporated particles splash and are deposited on the surface of the film substrate 1 being fed along the surface of the drum 4 to form a metal membrane on the surface of the film substrate 1. At this time, the DC power source 10 applies a positive or a negative voltage to the evaporated material-deposited film substrate 1 through the free roller 7b so as to generate a potential difference between the film substrate 1 and the drum 4. As a result, the film substrate 1 which has been brought into close contact with the drum 4 is cooled because the drum 4 contains cooling liquid which is circulating. The film substrate 1 then travels to the free roller 7a and is wound around the winding roller 6.

However, the above-described construction does not allow the evaporated material to adhere to the film substrate 1 with a great strength. In order to overcome this disadvantage, as a pre-treatment, it is necessary to remove water and impurities by means of annealing or impurities by means of plasma treatment and form irregularities on the surface of the film substrate 1. Thus, the manufacturing operation requires much time and labor, also requiring the provision of equipment for the pre-treatment if necessary. In addition, with the increase of the quantity of ions contained in splashed particles of the evaporation material 2 which has melted and been evaporated by the evaporation means, ions increasingly collide with the film substrate 1 opposite to the evaporation means. As a result, the film is thermally deformed by ion energy, namely, stretched, contracted or melted.

SUMMARY OF THE INVENTION

It is an object of the present invention to provide an evaporation apparatus for allowing evaporated particles to adhere to a film with a great strength by causing ions of evaporated particles to collide with the film at a great energy.

It is another object of the present invention to provide an evaporation apparatus for preventing a film from being thermally deformed by ion energy by appropriately controlling the quantity of ions which collide with the film as well as the adhesion strength of particles to the film.

In accomplishing these and other objects, there is provided an evaporation apparatus comprising: a vacuum chamber; a vacuum pump for producing a pressure-reduced atmosphere in the vacuum chamber; at least one vacuum evaporation means for evaporating an evaporation material held in a container 3 provided in the vacuum chamber; a drum, opposed to the vacuum evaporation means and rotating, for cooling a film substrate on which the evaporation material is to be deposited; a supply roller for supplying the film substrate to the drum; a winding roller for winding the film on which the evaporation material has been deposited; a free roller for assisting the winding and travel of the film substrate; a voltage applying means for applying a DC voltage through the free roller to the film substrate on which the evaporation material has been deposited; and electric current measuring means for measuring the intensity of electric current flowing between the film substrate on which the evaporation material has been deposited and the ground.

According to the above construction, a negative voltage is applied to the film substrate after the material is deposited on the film substrate, and a metal membrane formed on the film substrate is negatively charged. Therefore, ions of evaporated particles of the material collide with the film substrate at a high energy and as such, ion energy causes the metal membrane to adhere to the film substrate with a great strength. At this time, the electric current measuring means measures the intensity of electric current generated by ions passing through the metal membrane formed on the film substrate and the vacuum evaporation source so as to enable control of the quantity of ions colliding with the film by adjusting the intensity of electric current by means of the voltage of the DC power source. Thus, the metal membrane is capable of adhering to the film substrate with a favorable strength. In addition, ions can be prevented from colliding with the film substrate in a large quantity. Therefore, the thermal transformation of the film substrate such as stretching, contraction, and melting can be prevented. As a result, the film substrate can be wound around the winding roller without being wrinkled. Further, since it is unnecessary to provide the pre-treatment of the film substrate 1 for improving the adherence strength of evaporated metal particles, the producing operation does not require much time and labor, and does not require equipment for the pre-treatment.

BRIEF DESCRIPTION OF THE INVENTION

These and other objects and features of the present invention will become apparent from the following description taken in conjunction with the accompanying drawings, in which.

DETAILED DESCRIPTION OF THE INVENTION

Figure 1:
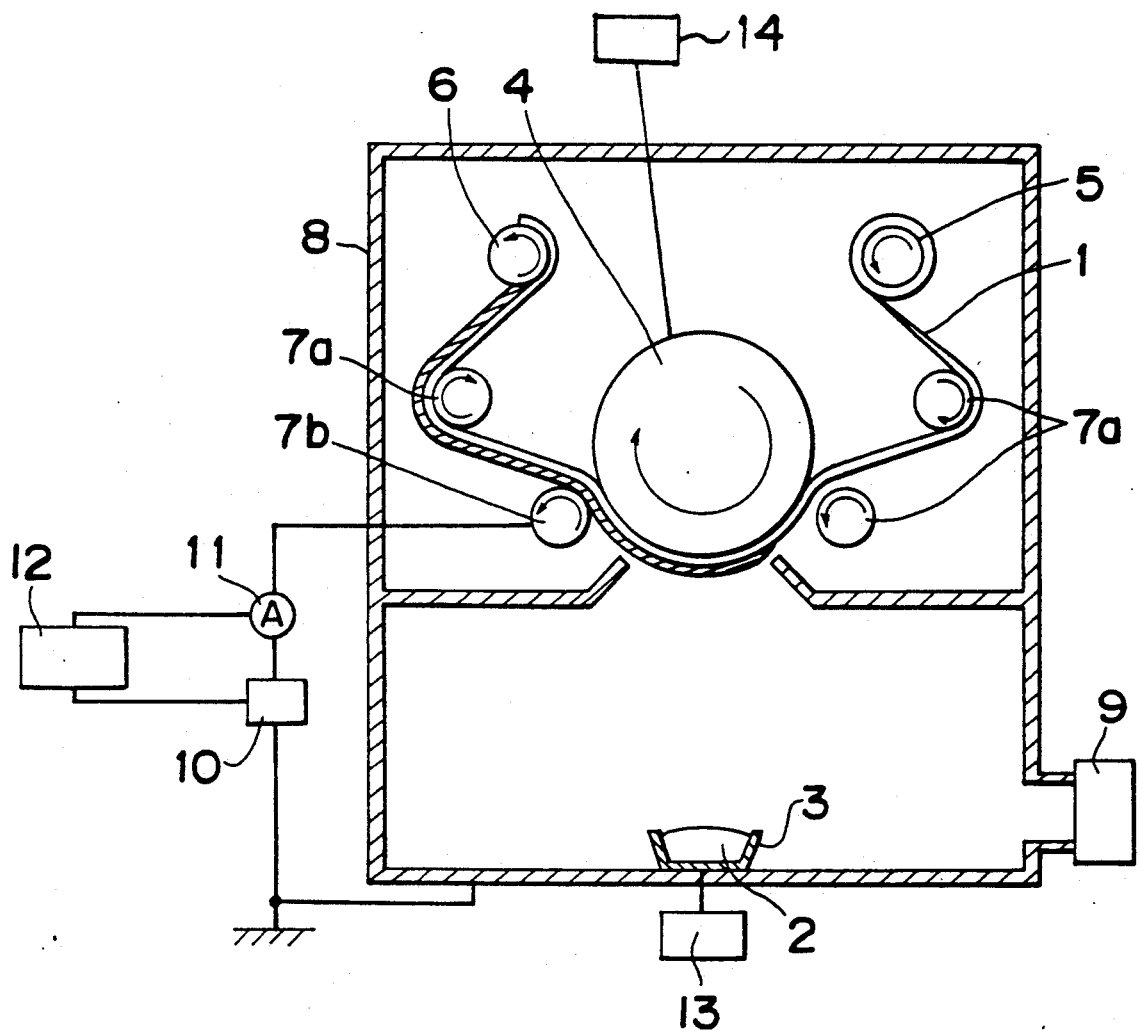
FIG. 1 is a schematic sectional view showing an evaporation apparatus according to an embodiment of the present invention.

Before the description of the present invention proceeds, it is to be noted that like parts are designated by like reference numerals throughout the accompanying drawings.

Figure 2:
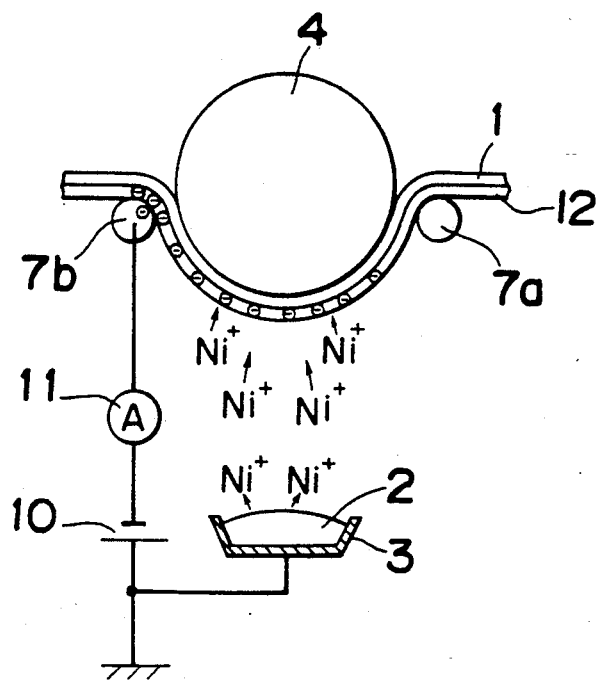
FIG. 2 is a schematic view showing an ammeter and an evaporation operation of the evaporation apparatus.
Figure 3:
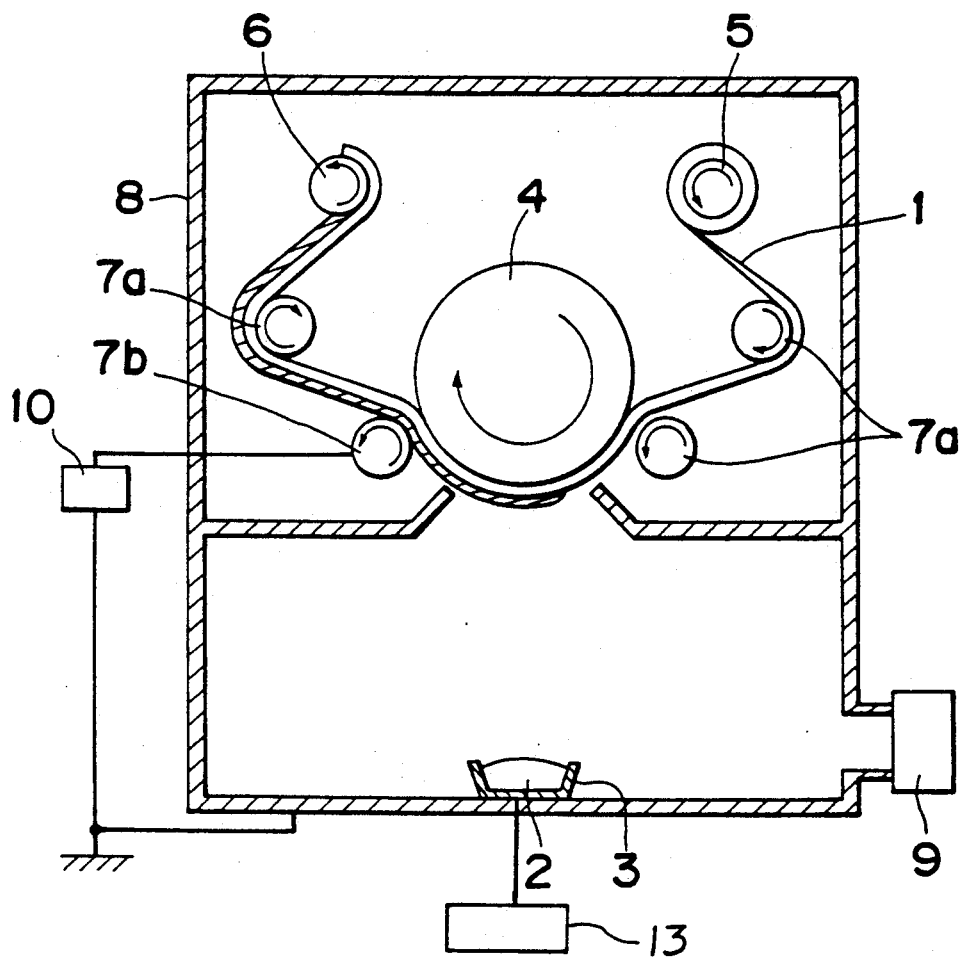
FIG. 3 is a schematic sectional view showing a conventional evaporation apparatus.

Referring to FIGS. 1 and 2, an evaporation apparatus according to an embodiment of the present invention is described below.

FIG. 1 is a schematic sectional view showing the evaporation apparatus according to the embodiment of the present invention. The difference between the above-described conventional apparatus and the embodiment is that the evaporation apparatus of the embodiment includes an ammeter 11 for measuring the intensity of electric current flowing between the film substrate 1 and the ground. FIG. 2 shows the ammeter 11 and the evaporation operation of the apparatus. The operation of the evaporation apparatus is described below with reference to FIGS. 1 and 2.

Similarly to the conventional evaporation apparatus, the interior of the vacuum chamber 8 is evacuated, for example, to the same vacuum degree as that of the conventional apparatus described above and the material 2 in the container 3 is evaporated by the evaporating means shown schematically at 13, which can be a resistance heating means, high frequency induction heating means or an electron beam as in the prior art, and adhered to the film substrate 1 to form a metal membrane. At this time, the DC power source 10 applies a voltage of 0 to −500 V to the metal membrane-deposited film substrate 1 through the free roller 7b so as to generate a potential difference between the film substrate 1 and the drum 4. Thereafter, the film substrate 1 closely contacts with the drum 4 in which cooling liquid is circulating and is them cooled and travels to the free rollers 7b and 7a and is finally wound around the winding roller 6. The ammeter 11 measures the intensity of electric current generated between the film substrate 1 and the ground so as to enable control by the controller 12 of the quantity of ions which collide with the film substrate 1 by adjusting current intensity to not more than 5.0 mA by means of the voltage of the DC power source 10 when nickel is deposited over the film substrate 1.

As described above, a negative voltage is applied to the film substrate 1 after the material 2 is deposited over the film substrate 1, and the metal membrane 12 formed on the film substrate 1 is negatively charged as shown in FIG. 2. Therefore, ions of evaporated particles of the material 2 collide with the film substrate 1 at a high energy and as such, ion energy causes the metal membrane 12 to adhere to the film substrate 1 with a great strength. At this time, the ammeter 11 measures the intensity of electric current generated by ions flowing through the metal membrane 12 formed on the film substrate 1 and the vacuum evaporation means 13 so as to control the quantity of ions colliding with the film substrate 1 by adjusting the intensity of electric current by means of the voltage of the DC power source 10 in accordance with the controller 12. Thus, the metal membrane 12 is capable of adhering to the film substrate 1 with a favorable strength. In addition, the colliding of a large quantity of ions with the film substrate can be prevented. Therefore, the thermal transformation of the film substrate such as stretching, contraction, and melting can be prevented. As a result, the film substrate can be wound around the winding roller 6 without being wrinkled. Further, since it is unnecessary to provide the pre-treatment of the film substrate 1 for improving the adherence strength of evaporated metal particles, the producing operation does not require much time and labor, and does not require equipment for the pre-treatment.

According to the embodiment, even though the film substrate 1 consists of polytetrafluoroethylene resin and as such, has a heat resisting temperature as low as 200° C., the film substrate 1 can be prevented from being thermally transformed. Therefore, nickel can be deposited over the film substrate 1 to a favorable strength.

In the embodiment, the intensity of electric current generated by ions is controlled by the voltage of the DC power source 10 in accordance with the controller 12. Alternatively the intensity of electric current can be controlled by adjusting the ionization degree of the material 2 by changing the power of, for example, the electron beam of the vacuum evaporation means 13.

The control operation may be manually performed by adjusting the voltage of the DC power source 10 without the controller 12. Additionally, a positive voltage may also be applied to the drum 4 by a voltage applying device 14 when a negative voltage is applied to the film substrate 1 after the material 2 is deposited on the film substrate 1, so that the surface of the drum 4 has a positive voltage to easily form a negative voltage on the film substrate 1 so as to improve t he strength. The ammeter 11 may be provided between the ground and the vacuum chamber 9 or between the ground and the DC power source 10.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. An apparatus comprising:
a vacuum chamber;

a vacuum pump for producing a pressure-reduced atmosphere in said vacuum chamber;

a supply roller rotatably mounted relative to said vacuum chamber for supplying a film substrate to travel along a path;

a drum for receiving the film substrate thereagainst and cooling the film substrate, said drum being rotatably mounted in said vacuum chamber;

a winding roller for winding the film substrate thereon, said winding roller being rotatably mounted relative to said vacuum chamber;

a free roller for assisting in travel of the film substrate along the path, said free roller being rotatably mounted relative to said vacuum chamber in a position along the path between said supply roller and said winding roller;

an evaporation material container mounted in said vacuum chamber opposite said drum for containing evaporation material to be evaporated;

an evaporation means for imparting energy to the evaporation material to cause evaporation and ionization thereof;

a voltage applying means for applying a DC voltage through said free roller to the film substrate to cause the evaporated and ionized evaporation material to be deposited on the film substrate; and an electric current measuring means for measuring an intensity of electric current flowing between the film substrate and a ground.

2. An apparatus as recited in claim 1, further comprising a control means for controlling the intensity of the electric current flowing between the film substrate and the ground.

3. An apparatus as recited in claim 2, wherein said control means is operable to control the intensity of the electric current flowing between the film substrate and the ground by controlling an amount of voltage applied by said voltage applying means to the film substrate.

4. An apparatus as recited in claim 2, wherein said control means is operable to control the intensity of the electric current flowing between the film substrate and the ground by controlling an amount of energy imparted to the evaporation material by said evaporation means.

5. An apparatus as recited in claim 1, further comprising a positive voltage application means for applying a positive voltage to said drum.

* * * * *